(12) United States Patent
Khan et al.

(10) Patent No.: US 10,224,514 B2
(45) Date of Patent: Mar. 5, 2019

(54) MULTILAYER DIAMOND DISPLAY SYSTEM AND METHOD

(71) Applicants: Adam Khan, San Francisco, CA (US); Robert Polak, Lindenhurst, IL (US); Priya Raman, Villa Park, IL (US)

(72) Inventors: Adam Khan, San Francisco, CA (US); Robert Polak, Lindenhurst, IL (US); Priya Raman, Villa Park, IL (US)

( * ) Notice: Subject to any disclaimer, the term of this patent is extended or adjusted under 35 U.S.C. 154(b) by 0 days.

(21) Appl. No.: 15/831,184

(22) Filed: Dec. 4, 2017

(65) Prior Publication Data

US 2018/0159082 A1 Jun. 7, 2018

Related U.S. Application Data

(60) Provisional application No. 62/429,769, filed on Dec. 3, 2016.

(51) Int. Cl.
| | |
|---|---|
| *H01L 51/52* | (2006.01) |
| *C23C 14/08* | (2006.01) |
| *C23C 14/22* | (2006.01) |
| *C23C 14/34* | (2006.01) |
| *C23C 16/27* | (2006.01) |
| *C23C 16/46* | (2006.01) |
| *C23C 14/10* | (2006.01) |
| *H01L 21/02* | (2006.01) |
| *H01L 31/0232* | (2014.01) |
| *H01L 27/32* | (2006.01) |

(52) U.S. Cl.
CPC ........ *H01L 51/5275* (2013.01); *C23C 14/083* (2013.01); *C23C 14/10* (2013.01); *C23C 14/221* (2013.01); *C23C 14/34* (2013.01); *C23C 16/27* (2013.01); *C23C 16/463* (2013.01); *H01L 21/02115* (2013.01); *H01L 31/0232* (2013.01); *H01L 27/323* (2013.01); *H01L 51/5281* (2013.01)

(58) Field of Classification Search
CPC .................................................. H01L 21/02109
See application file for complete search history.

(56) References Cited

U.S. PATENT DOCUMENTS

2010/0178018 A1\* 7/2010 Augusto .................. G02B 6/12
385/131

\* cited by examiner

*Primary Examiner* — Cheung Lee
(74) *Attorney, Agent, or Firm* — The Thompson Law Office, P.C.; Lawrence E. Thompson

(57) ABSTRACT

Disclosed herein is a transparent glass system that includes an optical grade silicon substrate, a transparent substrate layer; a titanium dioxide transparent layer, the transparent layer having an index of refraction of 2.35 or greater; and a polycrystalline diamond layer, wherein the transparent layer is between the substrate layer and the polycrystalline diamond layer.

1 Claim, 3 Drawing Sheets

FIG. 6
| Material | Young's Modulus (Gpa) | Vickers Hardness (GPA) | Thermal Conductivity (W/m-K) |
|---|---|---|---|
| Sapphire (Bulk) | 335 | --- | 27@298K |
| Diamond (Bulk) | 1220 | 115 | 2300@298K |
| Corning Gorilla Glass® 5 (Aluminosilicate Glass) | 76.7 | 5.89 | --- |
| Fused Silica Glass (Bulk) | 73 | 9.8 | 1.38@300K |
| Representation 500 | 457 | 67 | >600 |
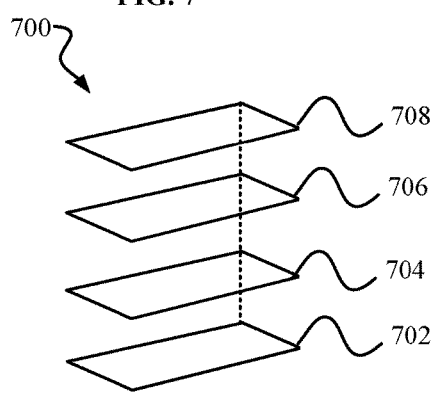
FIG. 7
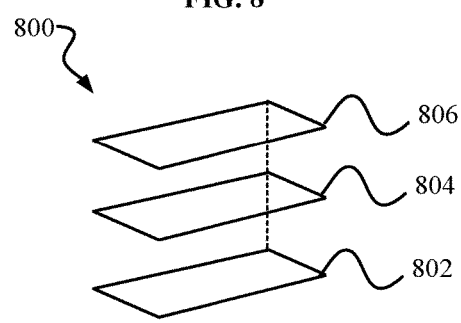
FIG. 8

MULTILAYER DIAMOND DISPLAY SYSTEM AND METHOD

CROSS-REFERENCE TO RELATED APPLICATION

This application claims the benefit of U.S. Provisional Application No. 62/429,769, filed Dec. 3, 2016, which is fully incorporated herein by reference.

BACKGROUND

Field

This invention is generally related to systems and methods for transparent diamond electronics, and more particularly to a system and method for providing a multilayer diamond display system.

Background

Diamond possesses favorable theoretical semiconductor performance characteristics, including the possibility of creating transparent electronics, including those related to consumer electronic component materials, such as display and lens materials. These applications often include more stringent design requirements, such as increased hardness, scratch resistance, and water resistance. However, practical diamond based semiconductor device applications for consumer electronic component materials remain limited.

SUMMARY

Disclosed herein is a new and improved system and method for a multilayer diamond display system. In accordance with one aspect of the approach, a multilayer diamond display system may include an optical grade silicon substrate, a transparent substrate layer; a titanium dioxide transparent layer, the transparent layer having an index of refraction of 2.35 or greater; and a polycrystalline diamond layer, wherein the transparent layer is between the substrate layer and the polycrystalline diamond layer.

In another approach, a method of fabricating a multilayer diamond display system may include the steps of selecting a substrate, forming a fused silica and titanium dioxide layer on the substrate, forming a fused silica layer on the fused silica and titanium dioxide layer, forming a titanium dioxide transparent layer on the fused silica layer; and forming a nanocrystalline diamond layer on the titanium dioxide layer.

Other systems, methods, aspects, features, embodiments and advantages of the system and method disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the system disclosed herein. In the figures, like reference numerals designate corresponding parts throughout the different views.

FIG. 6 is a table providing comparisons between the prior art materials and systems that may be produced using fabrication processes described herein, such as the embodiment illustrated in FIG. 5.

FIG. 7 is a schematic representation of another embodiment of a multilayer diamond system having interior and exterior diamond multilayers that may be produced using fabrication processes described herein, such as the processes illustrated in FIGS. 1 3.

FIG. 8 is a schematic representation of another embodiment of a multilayer diamond system having a monolithically integrated diamond capacitive layer that may be produced using fabrication processes described herein, such as the processes illustrated in FIGS. 1 3.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

Figure 1:
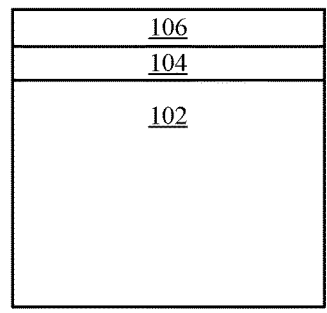
FIG. 1 is an exemplary schematic diagram of a fabrication process for a multilayer diamond display system.

The system and method provided herein allow for a novel diamond based multilayer antireflective coating system and a novel method for infrared optical windows. FIG. 1 shows an exemplary schematic diagram 100 of a fabrication process for a multilayer diamond display system. Diagram 100 includes a substrate material layer 102, a thin film composite layer 104, and a diamond layer 106. Substrate material layer 102 may include a transparent substrate, such as, but not limited to, aluminosilicate glass, for example, Corning Gorilla Glass® 3, commercial glass, for example, BK7, fused silica, quartz, sapphire, indium tin oxide, titanium dioxides, such as, but not limited to, crystalline rutile, in addition to others known to those having ordinary skill in the art. Any of the aforementioned materials, as well as combinations thereof, may be included in substrate layer 102.

The thin film composite layer 104 may include a transparent material with an index of refraction of 2.35 or greater. In one embodiment, titanium dioxide may be deposited on the substrate layer 102 via, for example, but not limited to, physical vapor deposition (PVD) sputtering or reactive ion deposition. In some embodiments, the first thin film layer may have an index of refraction ranging from 2.6 to 2.8. Crystalline titanium dioxide may be used in forming thin film composite layer 104. The thin film layer 104 may include lower refractive index transparent materials to favor transmission at blue, green, and red wavelength ranges. The thin film composite layer 104 may use materials optimized for operating wavelengths for blue light between 440 and 470 nm, green light between 510 and 550 nm, and red light between 600 and 640 nm wavelengths.

The diamond layer 106 may be fabricated by processes including seeding with a nanocrystalline diamond solution mixture. Fabrication of the diamond layer 106 may include acid cleaning, for example, via piranha and ionic clean methods. Fabrication of the diamond layer 106 may include ultrasonic roughening to facilitate more uniform and strong cohesion of growth diamond material. Fabrication of the diamond layer 106 may include chemical vapor deposition techniques, such as, but not limited to Hot Filament and Microwave Plasma methods. In one embodiment, nanocrystalline diamond materials may be formed under vacuum conditions using Methane, Hydrogen, and Argon gas.

Figure 2:
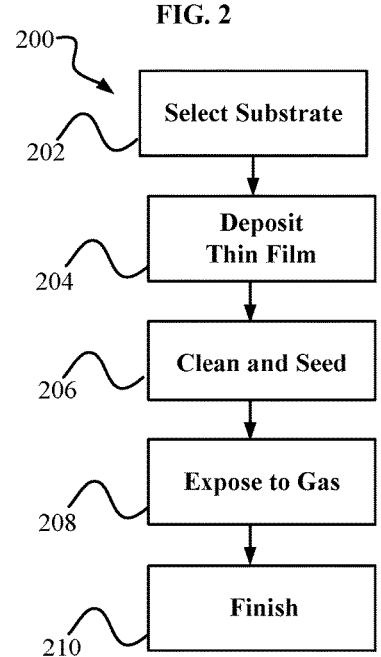
FIG. 2 is an exemplary block diagram of an embodiment of a method for fabricating a multilayer diamond display system, such as the display system of FIG. 1.

FIG. 2 shows an exemplary block diagram of an embodiment of a method 200 for fabricating a multilayer diamond systems, such as, but not limited to, the display system of diagram 100. Method 200 may include a step 202 of selecting a substrate material, such as an optical grade substrate, for example, the substrate of substrate material layer 102.

Method 200 may include a step 204 of depositing a thin film layer, such as, but not limited to thin film composite layer 104. Method 200 may include a step 206 of cleaning a seeding where the surface of the substrate may be acid cleaned, for example, via piranha and ionic clean methods, and ultrasonically roughened to facilitate more uniform and strong cohesion of growth diamond material. In step 206, the substrate may be seeded with a nanocrystalline diamond solution mixture.

Method 200 may include a step 208 of exposing the substrate to gas. Step 208 may include a cooled substrate wafer stage to maintain temperatures at or below 500 degrees Celsius allowing multilayer integration without exceeding stress, softening, and strain limitations of the underlying material layers. The diamond growth process energy is substantially derived from thermally activated filament sources or microwave activated plasma sources. Method 200 may include a step 210 of finishing a multiplayer diamond display system. Step 210 may include surface treatment, surface polishing, and packaging.

Figure 3:
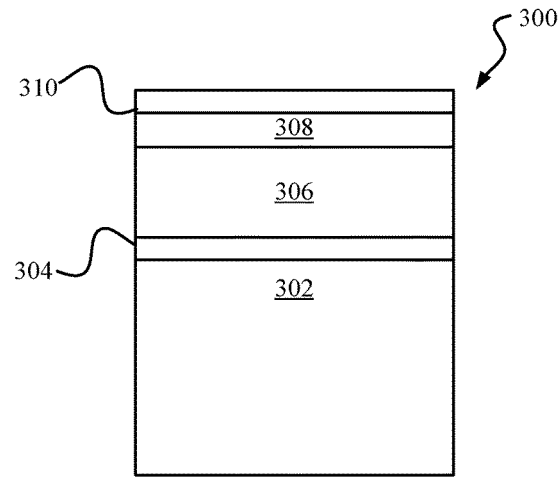
FIG. 3 is a further exemplary schematic diagram of a fabrication process for a multilayer diamond display system.

FIG. 3 shows another exemplary schematic diagram 300 of a fabrication process for a multilayer diamond display system. Diagram 100 includes a substrate material layer 302, a first thin film composite layer 304, a fused silica layer 306, a titanium dioxide layer 308, and a diamond top layer 310. Substrate material layer 302 may include a transparent substrate, such as those described in regard to substrate material layer 102.

The first thin film composite layer 304 may include fused silica and titanium dioxide producing a refractive index of about 1.75. The titanium dioxide layer 308 may have a refractive index values in the range of 2.6 to 2.8, but with a minimum value of 2.35. The diamond top layer 310 may be formed as described in regard to diamond layer 106.

Figure 4:
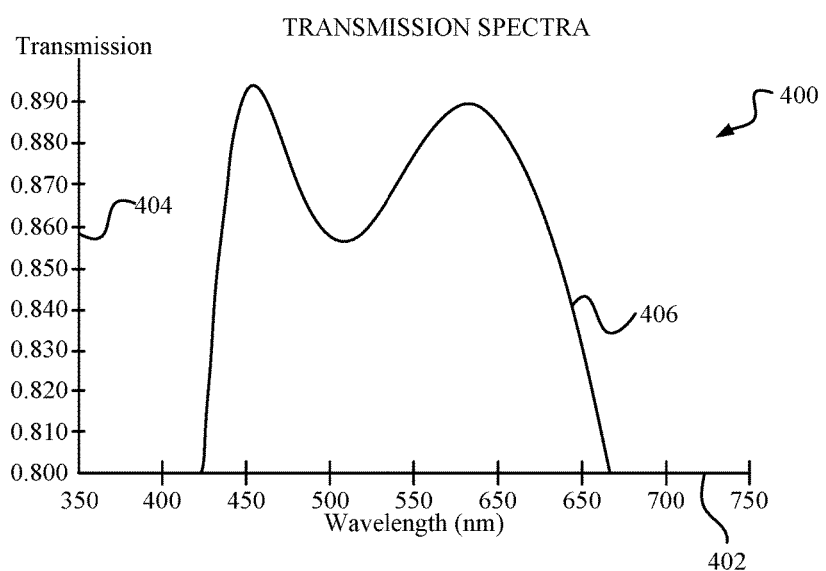
FIG. 4 is graphical transmission spectra that may be produced using fabrication processes described herein, such as the processes illustrated in FIG. 2 and FIG. 3.

FIG. 4 shows a graphical transmission spectra 406 that may be produced using fabrication processes described herein, such as the processes illustrated in FIG. 2 and FIG. 3. Graph 400 includes a horizontal axis 402 illustrating light wavelengths, and vertical axis 402 illustrating light wave transmission, through a system fabricated according to the techniques illustrated in FIG. 3, where the system includes: (a) a fused silica/titanium oxide layer, such as first thin film composite layer 304, of 44 nm; (b) a fused silica layer, for example, fused silica layer 306, of 186 nm; (c) a titanium dioxide layer, for example, titanium dioxide layer 308, of 67 nm; and (d) a diamond top layer, for example diamond top layer 310, of 40 nm. In spectra 406 the transmittance at the peak wavelengths are shown to be 89.7%, 86.2% and 87.1% for blue, green and red, respectively, yielding overall transmittance between 88-89%. This high level of transmittance is visually indistinguishable from present mobile and wearable display glass specifications of 92% in this wavelength range, such as standard Corning Gorilla Glass® 5. Increasing the number of multilayers may increase the transmittance beyond these values. Glass layers may be interspersed with other layers in order to tune transmittance peaks to desired visible wavelengths.

Figure 5:
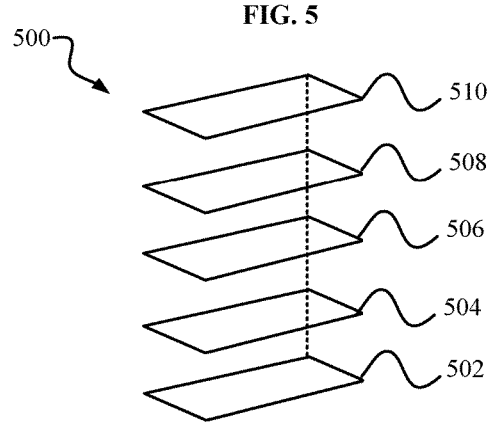
FIG. 5 is a schematic representation of an embodiment of a display glass multilayer diamond system that may be produced using fabrication processes described herein, such as the processes illustrated in FIGS. 1 3.

FIG. 5 is a schematic representation 500 of an embodiment of a display glass multilayer diamond system that may be produced using fabrication processes described herein, such as the processes illustrated in FIGS. 1 3. Representation 500 includes a rigid chassis layer 502, a flexible organic light emitting diode layer 504, a capacitive touch layer 506, interior lens glass layer 508, and an exterior glass lens layer 510. The rigid glass layer 502 may be, for example, include aluminum. The capacitive touch layer 506 may be include indium tin oxide and fused silica. The interior lens glass layer 508 may include Gorilla Glass. Exterior glass lens layer 510 may be formed by including systems and methods illustrated in FIGS. 1 and 2. Diamond multilayer structures, such as those illustrated by schematic 500, may provide desirable strength and hardness features which may operate with reduced thermal budget via higher thermal conductivity. Such strength and hardness features are illustrated in table 600, shown in FIG. 6, where features for representation 500 are shown in the bottom row. In table 600, nanocrystalline diamond is approximately 200 nanometers and the fused silica glass is approximately 500 microns.

FIG. 7 is a schematic representation 700 of another embodiment of a multilayer diamond system that may be produced using fabrication processes described herein, such as the processes illustrated in FIGS. 1 3. Representation 700 includes a rigid chassis layer 702, a flexible organic light emitting diode layer 704, a capacitive touch layer 706, and an exterior glass lens layer 708. Representation 700 may allow for the combination, or elimination, of an interior lens, such as interior lens 508 of representation 500. Exterior glass lens layer 708 may be formed by including systems and methods illustrated in FIGS. 1 and 2.

FIG. 8 is a schematic representation 800 of another embodiment of a multilayer monolithically integrated diamond system that may be produced using fabrication processes described herein, such as the processes illustrated in FIGS. 1 3. Representation 800 includes a rigid chassis layer 802, a flexible organic light emitting diode layer 804, and an exterior glass lens layer 506. Exterior glass lens layer 506 may be formed by including systems and methods illustrated in FIGS. 1 and 2. Representation 800 may allow for a multilayer diamond system of less than 0.5 millimeters. In representation 800, the capacitive touch layer may be incorporated as substrate layer. Representation 800 may provide a multilayer monolithically integrated diamond display module with mechanical, optical, and thermal tolerances meeting or exceeding display application demands.

The multilayer diamond display system described, and method 200, may incorporate systems and methods previously disclosed and described in U.S. Patent Publication No. 2013/0026492, by Adam Khan, published on Jan. 31, 2013; U.S. Pat. No. 8,354,290, issued to Anirudha Sumant, et al, on Jan. 15, 2013; U.S. Pat. No. 8,933,462, issued to Adam Khan on Jan. 13, 2015; U.S. Patent Publication No. 2015/0206749, by Adam Khan, published on Jul. 23, 2015; and U.S. Patent Publication No. 2015/0295134, by Adam Khan, et al, published on Oct. 15, 2015, all of which are fully incorporated herein by reference.

This disclosure provides several preferred embodiments of fabrication, however, the performance characteristics and materials characteristics described in this application are not necessarily performance bounds or limitations of the invention. These disclosures merely demonstrate some aspects of the invention that have presently been tested.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

We claim:

1. A method of fabricating a multilayer diamond display system, including the steps of:

selecting a substrate, forming a fused silica and titanium dioxide layer on the substrate;

forming a fused silica layer on the fused silica and titanium dioxide layer;

forming a titanium dioxide transparent layer on the fused silica layer; and forming a nanocrystalline diamond layer on the titanium dioxide layer.

* * * * *